United States Patent
Zhang

(10) Patent No.: US 7,826,302 B2
(45) Date of Patent: Nov. 2, 2010

(54) ROW DECODER FOR A MEMORY DEVICE

(75) Inventor: Ruili Zhang, Chandler, AZ (US)

(73) Assignee: STMicroelectronics S.r.l., Agrate Brianza (IT)

( * ) Notice: Subject to any disclaimer, the term of this patent is extended or adjusted under 35 U.S.C. 154(b) by 121 days.

(21) Appl. No.: 12/346,508

(22) Filed: Dec. 30, 2008

(65) Prior Publication Data

US 2010/0165779 A1 Jul. 1, 2010

(51) Int. Cl.
*G11C 8/00* (2006.01)

(52) U.S. Cl. .............................. 365/230.06; 365/230.01; 365/230.08

(58) Field of Classification Search ............ 365/230.01, 365/230.06, 230.08, 226
See application file for complete search history.

(56) References Cited

U.S. PATENT DOCUMENTS

| | | | |
|---|---|---|---|
| 7,606,102 B2 * | 10/2009 | Blodgett | 365/225.7 |
| 7,660,183 B2 * | 2/2010 | Ware et al. | 365/230.03 |
| 2001/0033195 A1 * | 10/2001 | Kanda et al. | 327/541 |
| 2008/0140974 A1 * | 6/2008 | Ware et al. | 711/167 |

* cited by examiner

*Primary Examiner*—Gene N. Auduong
(74) *Attorney, Agent, or Firm*—Lisa K. Jorgenson; Robert Iannucci; Seed IP Law Group PLLC

(57) ABSTRACT

A semiconductor memory device including an array of memory cells arranged in a plurality of rows and in a plurality of columns. The memory device further includes a plurality of word lines each associated with a respective row of the array and identified by a respective row address, and a row decoder configured to receive a current row address and select a word line according to said current row address. The row decoder includes a plurality of row selection units each associated with a respective word line and configured to receive the current row address; each row selection unit is configured to be enabled for biasing the respective word line to a selection voltage if the current row address identifies said word line. Each row selection unit includes a corresponding enabling device for enabling the row selection unit after a predetermined time from the reception of the current row address.

20 Claims, 4 Drawing Sheets

ROW DECODER FOR A MEMORY DEVICE

BACKGROUND

1. Technical Field

The present disclosure relates to the integrated memories field. Specifically, the present disclosure relates to a row decoder for an integrated memory device.

2. Description of the Related Art

Different types of semiconductor memory devices have been proposed in the last decades. Just to mention a few, examples of modern memory devices include static and dynamic random access memories (RAM), read only memories (ROM), and electrically erasable programmable read only memories ($E^2PROM$), such as flash and phase-change memories.

The data memorized in these devices is stored into a plurality of memory cells. Typically, the memory cells are arranged in rows and columns so as to form a bi-dimensional matrix. Each column of the matrix is associated with a corresponding column selection line—referred to as bit line—, and each row of the matrix is associated with a corresponding row selection line—referred to as word line. Each bit line is identified by a corresponding column address, while each word line is identified by corresponding row address.

In order to access a memory cell (e.g., for reading the data stored therein or for writing new data thereinto) belonging to a specific column and to a specific row, the bit line associated with said column and the word line associated with said row are selected by a selector circuit. For this purpose, the selector circuit includes a row decoder and a column decoder configured to decode row and column addresses, respectively, and accordingly bias the bit line and the word line identified by said addresses. In some memory architectures, blocks of more than one memory cell are accessed for being read or written simultaneously, i.e., in parallel to each other. Each of said blocks is generally formed by memory cells belonging to a same row; in this case, for accessing a block of memory cells, the selector circuit selects a word line together with a plurality of bit lines.

Known row decoders usually comprise a plurality of row selection units each for the selection of a respective word line. Particularly, each row selection unit is configured to selectively bias the respective word line to a selection voltage in response to the reception of the specific address which identifies said word line. For this purpose, the row selection units are suitably connected to an address bus formed by a plurality of lines each for providing a specific bit of the row address; for example, each line may convey a respective logic signal, whose value determines the value of a corresponding bit forming the row address. A row selection unit is selectively activated when the combination of the bit values provided by the address bus forms the row address which identifies the word line associated with said row selection unit.

However, this particular arrangement is affected by a serious drawback capable of hindering the correct progress of a reading or a writing operation.

After the selection of a specific word line identified by a specific row address and the completion of a reading or writing operation on addressed memory cells corresponding to said word line, the row address conveyed by the address bus is switched, e.g., for performing a further operation on memory cells corresponding to a different word line. During the transition from the previous row address to the one corresponding to the new word line, the logic signals carried by the lines of the address bus may switch their values at different instants. This may be due to different reasons, such as an asynchronous management of the addresses, or the different propagation delay amounts affecting each logic signal carried by the various lines. Consequently, before said signals have assumed their correct values, the row address carried by the address bus temporarily assumes an unpredicted value, which may trigger the selection of a wrong word line. This drawback may negatively affect the correct progress of the memory device operations, e.g., causing loss of data when a writing operation is performed on memory cells corresponding to a wrong word line.

BRIEF SUMMARY

In view of the above the Applicant has tackled the problem of improving the known solutions for implementing row decoders for memory devices.

One embodiment provides a semiconductor memory device including an array of memory cells arranged in a plurality of rows and in a plurality of columns. The memory device further includes a plurality of word lines each associated with a respective row of the array and identified by a respective row address, and a row decoder configured to receive a current row address and select a word line according to said current row address. The row decoder includes a plurality of row selection units each associated with a respective word line and configured to receive the current row address; each row selection unit is configured to be enabled for biasing the respective word line to a selection voltage if the current row address identifies said word line Each row selection unit includes a corresponding enabling device for enabling the row selection unit after a predetermined time from the reception of the current row address.

One embodiment provides a corresponding method.

One embodiment provides an electronic system including at least one memory.

BRIEF DESCRIPTION OF THE SEVERAL VIEWS OF THE DRAWINGS

The disclosure itself, as well as further features and the advantages thereof, will be best understood with reference to the following detailed description, given purely by way of a non-restrictive indication, to be read in conjunction with the accompanying drawings. Particularly.

DETAILED DESCRIPTION

In the following, a solution according to exemplary and non-limitative embodiments will be presented and described in detail. Those skilled in the art will however recognize that several modifications to the described embodiments are possible, and that the present invention can be embodied in different ways.

Figure 1:
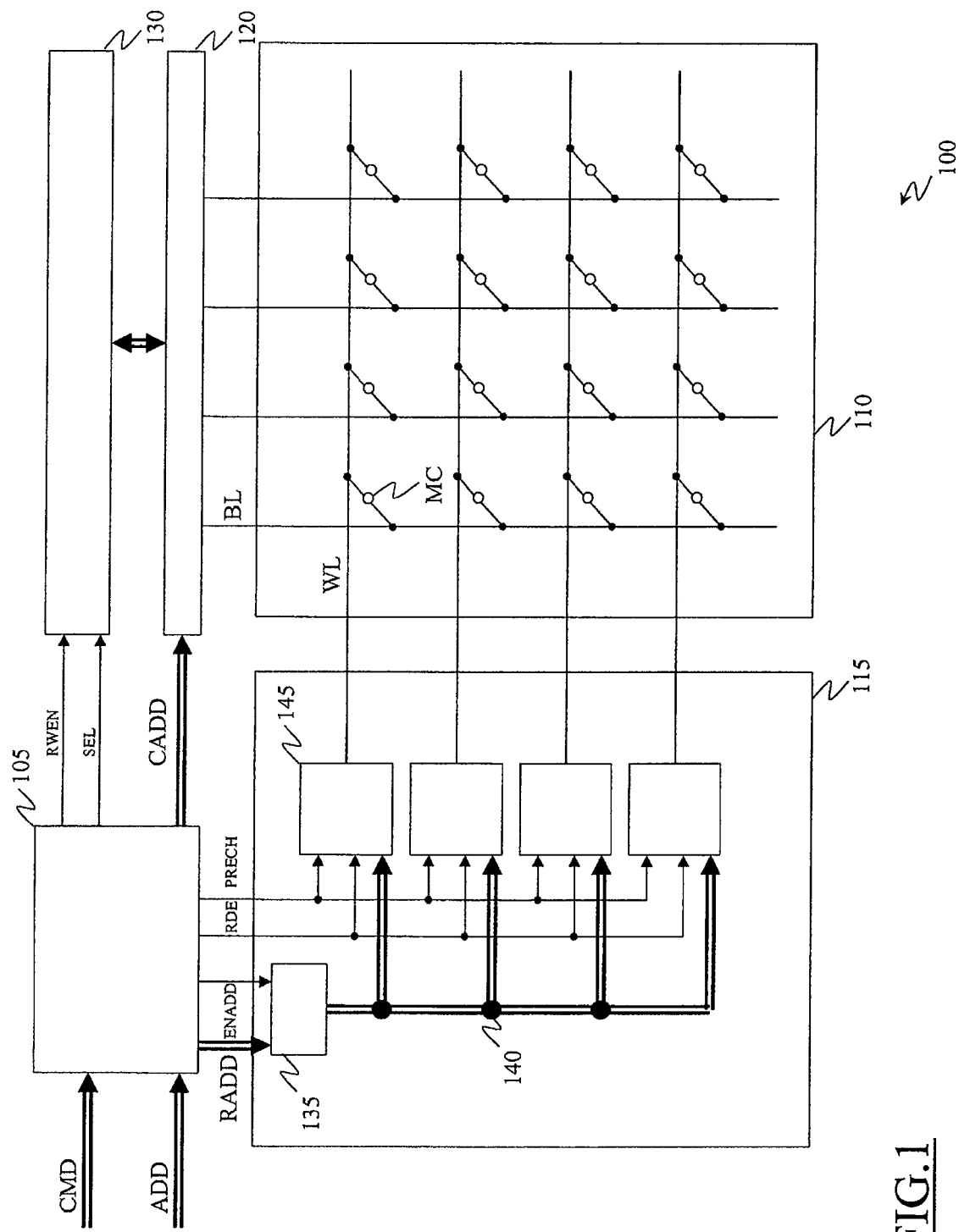
FIG. 1 schematically illustrates a semiconductor memory device according to an embodiment.

FIG. 1 schematically illustrates a semiconductor memory device 100 according to an embodiment.

The semiconductor memory 100 comprises a main logic block 105 and a memory array 110 comprising a plurality of memory cells MC arranged in rows and columns. The semiconductor memory 100 includes a plurality of bit lines BL each associated with a respective column of the memory array 110, and a plurality of word lines WL each associated with a respective row of the memory array 110.

The main logic block 105 is configured to manage operations to be performed on the memory cells of the memory array 110 in response to commands CMD and addresses ADD received from the outside of the memory. Particularly, the main logic block 105 is configured to receive the commands CMD and accordingly determine an operation (for example, a reading or a programming operation) to be performed on selected memory cells of the memory array 110 identified by the specific address ADD.

In response to the received address ADD, the main logic block 105 generates a corresponding row address RADD and a corresponding column address CADD. The row address RADD is sent to a row decoder 115, which accordingly selects a word line WL, while the column address CADD is sent to a column decoder 120, which accordingly selects a set of bit lines BL.

Moreover, the main logic block 105 is coupled with a read and program circuit 130 including all the components (such as sense amplifiers, comparators, charge pumps, reference cells, pulse generators, and the like) which are used to program the memory cells MC, or to read the values stored therein. Based on the received command CMD, the main logic block 105 drives said read and program circuit 130 for performing a reading or a programming operation on the memory cells MC associated with the selected word line WL and bit lines BL. Particularly, the read and program unit 130 is activated by the main logic block 105 through a read/write enable signal RWEN for performing a reading or a writing operation based on an operation selection signal SEL, which is generated by the main logic block 105 according to the received command CMD.

The semiconductor memory 100 depicted in FIG. 1 is a phase change memory, wherein each memory cell MC is made of a phase change material. Typically, the phase change material consists of a chalcogenide (such as an alloy $Ge_2Sb_2Te_5$). Without descending to particulars well known in the art, the phase change material can be reversibly switched between a generally amorphous, disordered phase and a generally crystalline, high ordered phase. The two phases of the material exhibit different electrical characteristics; particularly, the material in the amorphous phase has a high resistivity (defining a reset state associated with a first logic value, for example, "0"), whereas the material in the crystalline phase has a low resistivity (defining a set state associated with a second logic value, for example, "1"). It has to be appreciated that the present invention is in no way limited to the phase change memories, the concept thereof being applicable to any semiconductor memory, such as SRAM, DRAM and flash memories.

According to an embodiment, the row decoder 115 includes a row address switch 135 having an input terminal for receiving the row address RADD provided by the logic block 105, an output terminal connected to a row decoder bus 140 and a control terminal for receiving an address enable signal ENADD generated by the logic block 105. If the address enable signal ENADD is deasserted by the logic block 105, the row address switch 135 is open; when the logic block 105 asserts the address enable signal ENADD, the row address switch 135 switches to a closed condition, providing the row address RADD to the row decoder bus 140. The row decoder 115 further includes a plurality of row selection units 145 each for the selection of a corresponding word line WL. For this purpose, each row selection unit 145 is connected to a respective word line WL and to the row decoder bus 140. As will be described in greater detail in the following of the present description, a row selection unit 145 is configured to select the corresponding word line WL biasing it to a selection voltage SV—such as a supply voltage of the semiconductor memory 100—if the row address RADD provided by the row decoder bus 140 is the one identifying said word line WL. On the contrary, a deselected word line WL is biased by the corresponding row selection unit 145 to a deselecting voltage DV—such as the ground voltage.

According to an embodiment, the row selection units 145 receive from the logic block 105 a row decoder enable signal RDE and a precharge signal PRECH. As will be better described in the following of the present description, the precharge signal PRECH is exploited to precharge the row selection units 145 before any word line selection. The row decoder enable signal RDE is instead configured to be deasserted by the logic block 105 for disabling the row selection units 145, in such a way that all the word lines WL are deselected, i.e., biased to the deselecting voltage DV. As soon as the row decoder enable signal RDE is asserted, the row selection unit 145 that corresponds to the word line WL identified by the row address RADD selects said word line WL, biasing it to the selection voltage SV.

Figure 2:
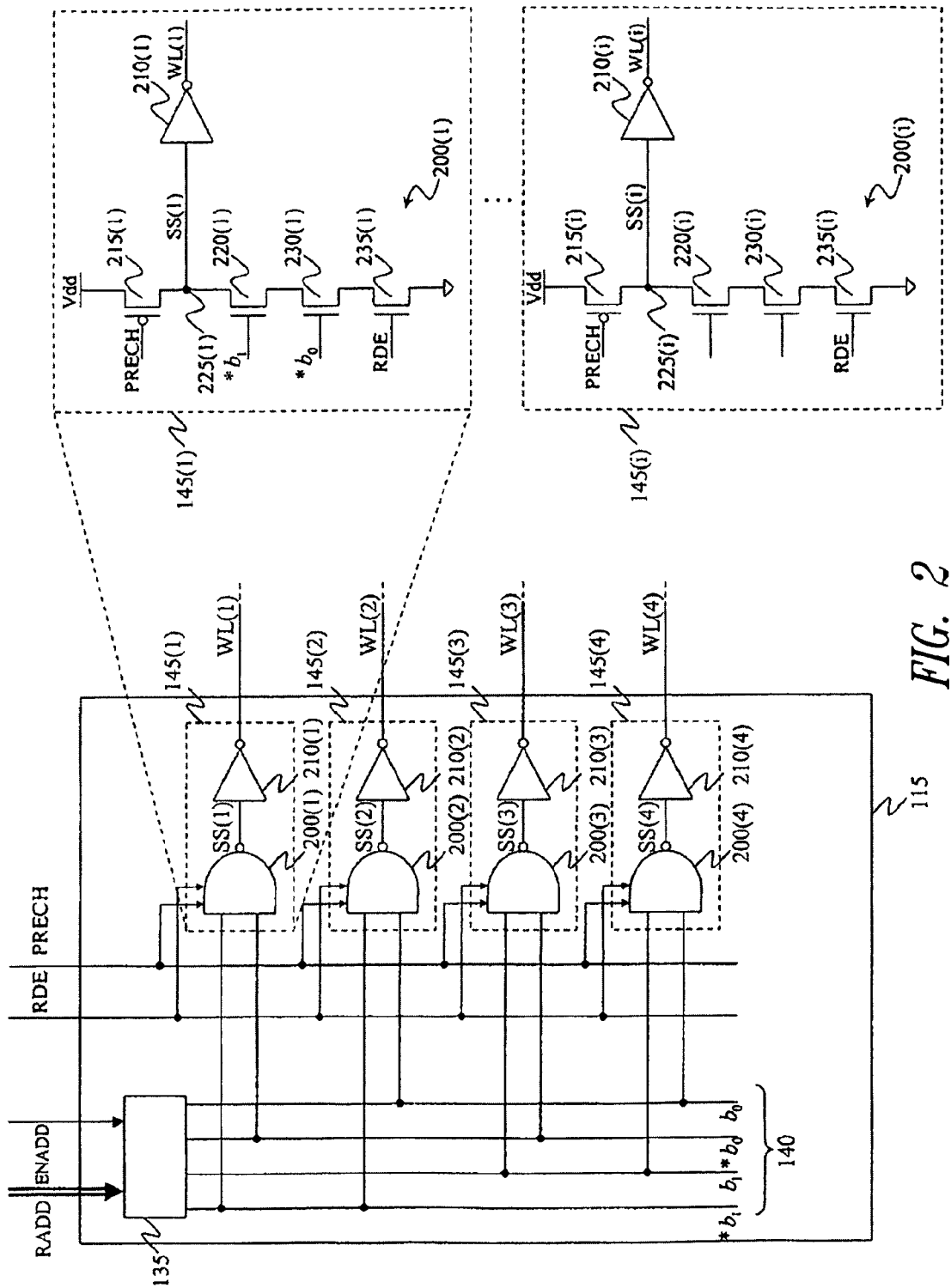
FIG. 2 schematically illustrates the structure of a row decoder of the memory device of FIG. 1 according to an embodiment.

In order to better describe the structure of the row decoder 115 according to an embodiment, reference will be now made to FIG. 2. Particularly, FIG. 2 illustrates in greater detail the structure of the row decoder 115 according to an exemplary (and very simplified) embodiment, in which the memory cells MC of the memory array 110 are arranged in four rows, each one associated with a respective word line WL(i) (i=1 to 4), identified in turn by a respective row address RADD(i) and configured to be selected by a corresponding row selection unit 145(i). It has to be appreciated that the concepts of the present disclosure are directly applicable to more realistic cases, wherein the memory cells MC included in the memory arrays 110 are arranged in a higher number of rows, such as 2024 or more.

According to this example, the row addresses RADD(i) are formed by two bits, namely $b_0$ and $b_1$. The first word line WL(1) is identified by the row address RADD(1), corresponding to $b_0=0$ and $b_1=0$; the word line WL(2) is identified by the row address RADD(2), corresponding to $b_0=1$ and $b_1=0$; the word line WL(3) is identified by the row address RADD(3), corresponding to $b_0=0$ and $b_1=1$; and the word line WL(4) is identified by the row address RADD(4) corresponding to $b_0=1$ and $b_1=1$. In this case, the row decoder bus 140 may include four different lines, and particularly: a first line *$b_1$, which is brought to a high voltage (such as the supply voltage) when the bit $b_1$ of the row address RADD(i) is equal to 0, and to a low voltage (such as the ground voltage) when the bit $b_1$ of the row address RADD(i) is equal to 1; a second line $b_1$, which is brought to the high voltage when the bit $b_1$ of the row address RADD(i) is equal to 1, and to the low voltage when the bit $b_1$ of the row address RADD(i) is equal to 0; a third line *$b_0$, which is brought to the high voltage when the bit $b_0$ of the row address RADD(i) is equal to 0, and to the low voltage when the bit $b_0$ of the row address RADD(i) is equal to 1; and a fourth line $b_0$, which is brought to the high voltage when the bit $b_0$ of the row address RADD(i) is equal to 1, and to the low voltage when the bit $b_0$ of the row address RADD(i) is equal to 0.

According to an embodiment, each row selection unit 145(i) comprises a logic gate 200(i) having input terminals connected to the row decoder bus 140 and an output terminal for providing a respective selection signal SS(i) to an input terminal of a driver element 210(i). Particularly, each logic gate 200(i) is configured to assert (e.g., to the ground voltage) the respective selection signal SS(i) if the row decoder bus 140 provides the row address RADD(i) identifying the word line WL(i). The driver element 210(i) has an output terminal connected to the word line WL(i) for providing the selection voltage SV when the selection signal SS(i) is asserted, and the deselecting voltage DV when the selection signal SS(i) is deasserted.

According to an exemplary embodiment, the logic gates 200(i) are NAND gates, and the driver elements 210(i) are NOT gates. It has to be appreciated that the concepts of the present disclosure are applicable to any type of logic gates (or equivalent circuits) and drivers.

Making reference to the example at issue, the logic gate 200(1) of the row selection unit 145(1) has a first input connected to the line $*b_1$ and a second input connected to the line $*b_0$; the logic gate 200(2) of the row selection unit 145(2) has a first input connected to the line $*b_1$ and a second input connected to the line $b_0$; the logic gate 200(3) of the row selection unit 145(3) has a first input connected to the line $b_1$ and a second input connected to the line $b_0$; the logic gate 200(4) of the row selection unit 145(4) has a first input connected to the line $b_1$ and a second input connected to the line $b_0$. When the row decoder bus 140 provides the address RADD(1) identifying the word line WL(1), the selection signal SS(1) is asserted to the ground voltage by the logic gate 200(1), while the other selection signals SS(i) are deasserted at the supply voltage; in this way, the word line WL(1) is biased to the selection voltage SV by the driver element 210(1). When the row decoder bus 140 provides instead the address RADD(2) identifying the word line WL(2), the selection signal SS(2) is asserted to the ground voltage by the logic gate 200(2), while the other selection signals SS(i) are deasserted at the supply voltage; in this way, the word line WL(2) is biased to the selection voltage SV by the driver element 210(2). When the row decoder bus 140 provides the address RADD(3) identifying the word line WL(3), the selection signal SS(3) is asserted to the ground voltage by the logic gate 200(3), while the other selection signals SS(i) are deasserted at the supply voltage; in this way, the word line WL(3) is biased to the selection voltage SV by the driver element 210(3). Finally, when the row decoder bus 140 provides the address RADD(4) identifying the word line WL(4), the selection signal SS(4) is asserted to the ground voltage by the logic gate 200(4), while the other selection signals SS(i) are deasserted at the supply voltage; in this way, the word line WL(4) is biased to the selection voltage SV by the driver element 210(4).

According to an embodiment, each logic block 200(i) is provided with two additional input terminals for receiving the row decoder enable signal RDE and the precharge signal PRECH from the logic block 105. FIG. 2 illustrates in greater detail the circuit structure of one logic gate 200(i)—namely, the logic gate 200(1) included in the row selection unit 145(i)—according to an embodiment. Particularly, the logic gate 200(1) includes a precharge switch 215(1), for example a p-channel MOS transistor having a source terminal connected to a terminal Vdd providing the supply voltage, a gate terminal for receiving the precharge signal PRESCH, and a drain terminal connected to a first address switch 220(1), for example an n-channel MOS transistor. The first address switch 220(1) has a drain terminal connected to the drain terminal of the precharge switch 215(1) (circuit node 225(1)), a gate terminal connected to the line $*b_1$ of the row decoder bus 140 and a source terminal connected to a second address switch 230(1), for example an n-channel MOS transistor. The second address switch 230(1) has a drain terminal connected to the source terminal of the first address switch 220(1), a gate terminal connected to the line $*b_0$ of the row decoder bus 140 and a source terminal connected to an enabling switch 235(1), for example an n-channel MOS transistor. The enabling switch 235(1) has a drain terminal connected to the source terminal of the second address switch 230(1), a gate terminal for receiving the row decoder enable signal RDE and a source terminal connected to a terminal providing the ground voltage. The selection signal SS(1) is taken at the circuit node 225 of the logic gate 200(1), which is connected to the input terminal of the driver element 210(1).

The circuit structure of the other logic elements 200(i) is similar to that of the logic gate 200(1), with a precharge switch 215(i) configured to receive the precharge signal PRECH, an enabling switch 235(i) configured to receive the row decoder enable signal RDE, and first and second address switches 220(i), 230(i) connected to respective lines of the decoder bus 140.

Figure 3:
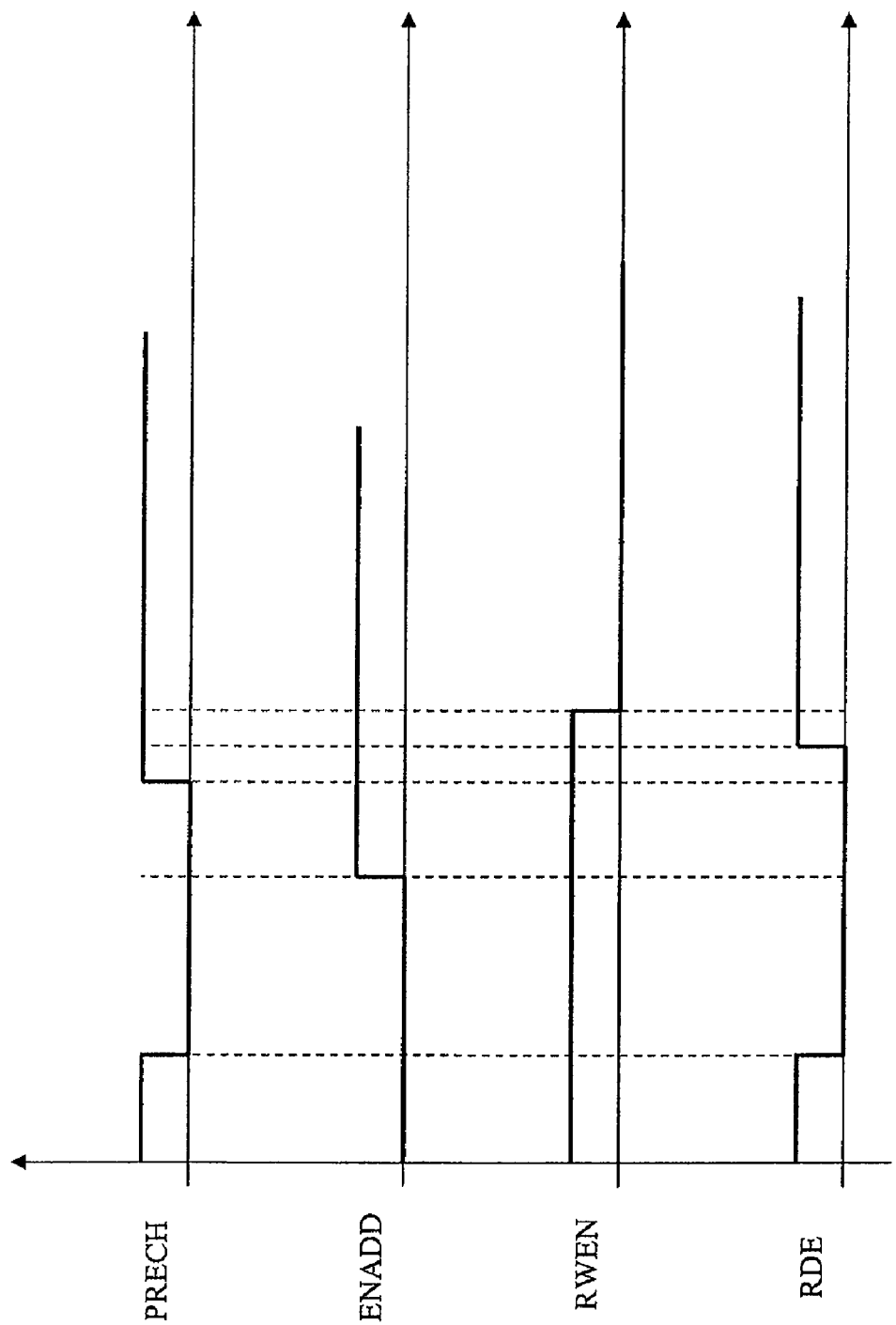
FIG. 3 is a diagram illustrating time patterns of some signals generated by the logic block included in the memory device of FIG. 1 during a reading or a writing operation according to an embodiment.

In order to describe how the row decoder 115 operates during a reading or a writing operation according to an embodiment, reference will be now made to FIG. 3 together with FIGS. 1 and 2. FIG. 3 is a diagram illustrating the time patterns of some signals generated by the logic block 105 during a reading or a writing operation according to an embodiment.

Particularly, the address enable signal ENADD is initially kept deasserted, e.g., to the ground voltage, in such a way that the row address switch 135 is open, and the various row selection units 145(i) do not receive any row address RADD.

As soon as the semiconductor memory 100 is instructed—through a command CMD—to perform an operation directed to a group of memory cells MC identified by an address ADD, the precharge signal PRECH is asserted for deselecting all the word lines WL(i). For example, the precharge signal PRECH is asserted to the ground voltage for turning on the precharge switch 215(i) in all the logic gates 200(i) and charging the parasitic capacitance (not shown) of the circuit node 225(i). In this way, the selection signals SS(i) are brought to the supply voltage, and the word lines GWL(i) are accordingly biased to the deselecting voltage DV by the driver elements 210(i).

At the transition (falling) edge of the precharge signal PRECH, the row decoder enable signal RDE is deasserted by the logic block 105, for temporarily preventing any word line selection. Particularly, the row decoder enable signal RDE is deasserted to the ground voltage for turning off the enabling switch 235(i) in all the logic gates 200(i). In this way, the charge stored in the parasitic capacitance at the circuit node 225(i) cannot discharge toward the ground terminal, so that all the selection signals SS(i) are kept at the supply voltage. Consequently, all the word lines WL(i) are kept at the deselecting voltage DV.

After a predetermined period of time, the logic block 105 asserts the address enable signal ENADD, e.g., to the supply voltage, for closing the row address switch 135. In this way, a row address RADD generated by the logic unit 105 according to the received address ADD is provided to the row decoder bus 140. As already mentioned in the introduction of the present document, the voltages of the lines forming the row decoder bus 140 take an amount of time for reaching the values corresponding to a generic row address RADD; moreover, said amount of time may be different from one line to another one, and may depend on value of the specific row address RADD provided by the logic unit 105. Thus, before the voltages of the lines in the row decoder bus 140 have assumed their correct values, the row address RADD provided by said bus may temporarily assume an unpredicted value. However, in the proposed solution, the row decoder enable signal RDE is kept deasserted during this period, in such a way to prevent any selection of the word lines WL(i). Indeed, regardless of the current value of the row address RADD provided by the row decoder bus 140, the enabling switches 235(i) of all the logic gates 220(i) are turned off, and the charge stored in the parasitic capacitance at the circuit nodes 225(i) cannot discharge toward the ground terminal. Thus, all the selection signals SS(i) are kept at the supply voltage, and all the word lines WL(i) are kept at the deselecting voltage DV.

Then, the logic block 105 deasserts—e.g., to the supply voltage—the precharge signal PRECH, for turning off the precharge switch 215(i) in all the logic gates 200(i). The selection signals SS(i) remain at the supply voltage, because the charge stored in the parasitic capacitance of the circuit nodes 225(i) cannot discharge toward ground, the enabling switches 235(i) being still turned off.

After a predetermined amount of time, sufficient for the voltages of the lines forming the row decoder bus 140 to stabilize, the row decoder enable signal RDE is asserted, e.g., to the supply voltage, and the enabling switches 235(i) of all the logic gates 200(i) are turned on.

In this condition, a specific logic gate 220(i) among the others has all the address switches 220(i), 230(i) of the corresponding logic gate 200(i) that are turned on, too, and particularly the one corresponding to the word line WL(i) identified by the specific row address RADD(i) value provided by the row decoder bus 140. This logic gate 200(i) is the only one having the corresponding circuit node 225(i) that is electrically connected to the ground terminal, through the series of the (closed) address switches 220(i), 230(i) and the enabling switch 235(i). Thus, the charge stored in the parasitic capacitance of said circuit node 225(i) discharges toward ground, and the corresponding selection signal SS(i) switches to the ground voltage. As a consequence, the driver element 210(i) coupled with said logic gate 200(i) selects the corresponding word line, biasing it to the selection voltage SV.

Once the word line WL(i) has been selected, the logic block 105 asserts, e.g., to the ground voltage, the read/write enable signal RWEN for activating the read and program unit 130 in such a way to perform an operation on the addressed memory cells MC according to the operation selection signal SEL.

Reassuming, with the proposed solution all the drawbacks that negatively affect the correct operation of the known memory devices are resolved, by advantageously disabling the selection of any word line for an amount of time sufficient for the address provided by the address bus to stabilize.

Figure 4:
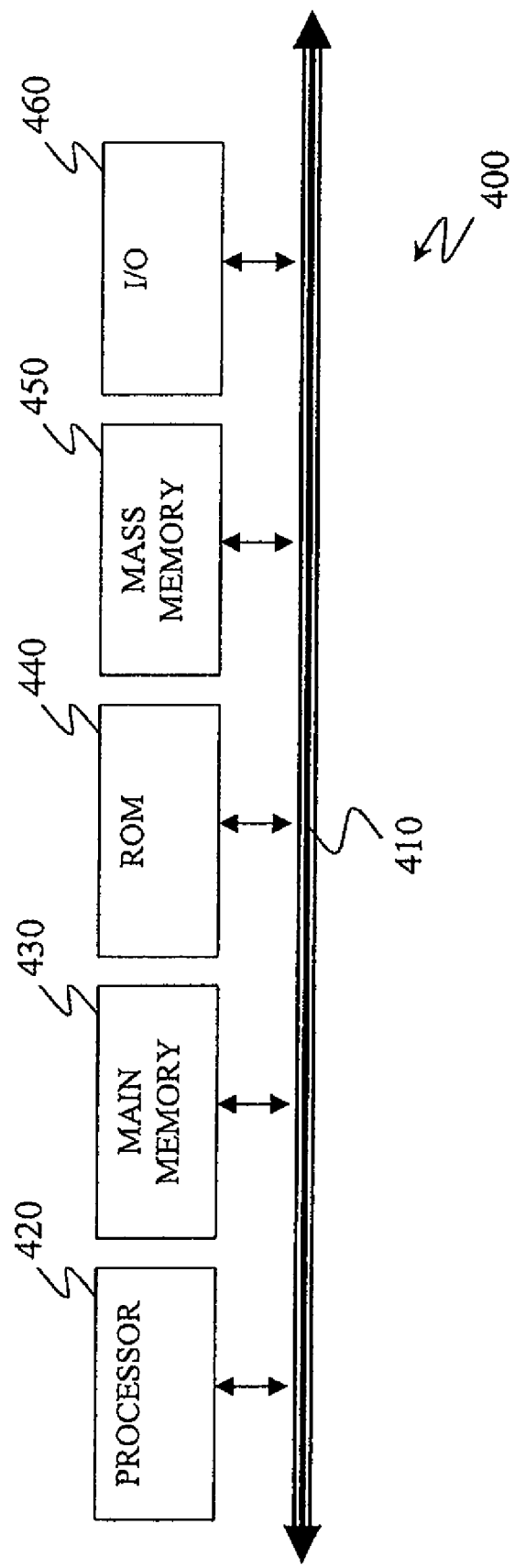
FIG. 4 schematically illustrates a portion of an exemplary electronic system according to one embodiment.

FIG. 4 schematically illustrates a portion of an exemplary electronic system 400 according to an embodiment. The electronic system 400 may be for example a computer, a personal digital assistant (PDA), a laptop or portable computer, a digital music player, a digital camera, or other devices that may be configured to exploit an integrated non-volatile memory device.

The electronic system 400 is formed by several units that are connected in parallel to a system or communication bus 410 (with a structure that is suitably scaled according to the actual function of the system 400). In detail, one or more processors 420 control operation of the system 400; a main memory 430 is directly used as a working memory by the processors 420, and a ROM 440 stores basic code for a bootstrap of the system 400. Moreover, the system 400 is provided with a mass memory 450 for storing data and programs, and input/output units 460 for receiving/providing data from/to the outside.

The system 400 may exploit the advantages of the proposed solution by implementing the ROM 440, the main memory 430 and/or the mass memory 450 with at least one semiconductor memory such as the semiconductor memory 100 discussed herein.

Naturally, a person skilled in the art may apply to the solution described above many logical and/or physical modifications and alterations. More specifically, although the present disclosure describes with a certain degree of particularity with reference to some embodiments, it should be understood that various omissions, substitutions and changes in the form and details as well as other embodiments are possible. Particularly, the proposed solution may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

The invention claimed is:

1. A semiconductor memory device comprising:
  an array of memory cells arranged in a plurality of rows and in a plurality of columns;
  a plurality of word lines associated respectively with the rows of the array and identified by respective row addresses;
  a row decoder configured to receive a current row address and select one of the word lines according to said current row address, the row decoder including:
  a plurality of row selection units associated respectively with the word lines and configured to receive the current row address, each row selection unit being configured to be enabled for biasing the respective word line to a selection voltage if the current row address identifies said word line, wherein:
  each row selection unit includes a corresponding enabling device configured to enable the row selection unit after a time from the reception of the current row address.

2. The memory device of claim 1, wherein the row decoder includes an address bus for transporting the current row address, and wherein each row selection unit includes:
  input terminals coupled with the address bus for receiving the current row address;
  a control terminal for providing a row selection enable signal to the enabling device;
  a logic device configured to be driven by the enabling device according to the row selection enable signal and configured to assert a selection signal based on the received current address; and
  a driver element configured to bias the word line associated with the row selection unit to the selection voltage when the selection signal is asserted.

3. The memory device of claim 2, further including a main logic block configured to generate an address enable signal, the memory device including a row address switch configured to provide the current row address to the address bus when the address enable signal is asserted.

4. The memory device of claim 3, wherein the main logic block is further configured to generate the row selection enable signal according to the address enable signal.

5. The memory device of claim 4, wherein the main logic block is configured to assert the row selection enable signal after a predetermined time from the assertion of the address enable signal, the logic device being configured to assert the selection signal in response to the assertion of the row selection enable signal.

6. The memory device of claim 5, wherein the logic device includes:
a deassertion branch configured to deassert the selection signal for a predetermined deassertion time starting from the assertion of the row selection enable signal;
an assertion branch including the enabling device and a set of address switches coupled with the address bus for receiving the current row address, the assertion branch being configured to assert the selection signal when the current row address corresponds to the row address identifying the word line associated with the row selection unit and the row selection enable signal is asserted.

7. The memory device of claim 6, wherein the selection signal is the voltage of an output circuit node of the logic device, and wherein:
the deassertion branch includes a first controlled switch connected between the output circuit node and a terminal providing a first reference voltage, said first controlled switch being configured to electrically couple the circuit node to with the terminal providing the first reference voltage during the predetermined deassertion time;
the assertion branch is connected between the output circuit node and a terminal providing a second reference voltage different from the first, said enabling device being a switch controlled by the row selection enable signal and connected in series with the address switches, said assertion branch being configured to electrically couple the circuit node to the terminal providing the second reference voltage when the current row address corresponds to the row address identifying the word line associated with the row selection unit and the row selection enable signal is asserted.

8. The memory device of claim 7, wherein said selection signal is asserted if the output circuit node is at the second reference voltage.

9. A method for managing a memory device, including:
storing data into an array of memory cells arranged in a plurality of rows and a plurality of columns, the rows of the array being associated respectively with word lines identified by respective row addresses, wherein the step of storing data includes:
receiving a current row address;
selecting a word line according to said current row address, wherein said selecting the word line includes:
providing the current row address to a set of row selection units associated respectively with the word lines; and
enabling a selected row selection unit, of the set of row selection units, associated with a selected word line, of the word lines, corresponding to the current row address after a time from receiving the current row address for biasing the selected word line to a selection voltage.

10. The method of claim 9, further comprising:
generating an address enable signal; and
providing the current row address to an address bus when the address enable signal is asserted, the address bus being coupled to the row selection units.

11. The method of claim 10, further comprising generating the row selection enable signal according to the address enable signal.

12. The method of claim 11, wherein generating the row selection enable signal includes asserting the row selection enable signal after a predetermined time from the assertion of the address enable signal, the method further comprising asserting a selection signal in response to the assertion of the row selection enable signal, the selection signal causing a driver device to bias the selected word line to the selection voltage.

13. An electronic system, comprising:
a processor;
input/output units for receiving and providing data; and
a memory that includes:
an array of memory cells arranged in a plurality of rows and in a plurality of columns;
a plurality of word lines associated respectively with the rows of the array and identified by respective row addresses;
a row decoder configured to receive a current row address and select a selected word line of the word lines according to said current row address, the row decoder including:
a plurality of row selection units associated respectively with the word lines and configured to receive the current row address, each row selection unit being configured to be enabled for biasing the respective word line to a selection voltage if the current row address identifies said word line, wherein:
each row selection unit includes a corresponding enabling device for enabling the row selection unit after a time from the reception of the current row address.

14. The system of claim 13, wherein the row decoder includes an address bus for transporting the current row address, and wherein each row selection unit includes:
input terminals coupled with the address bus for receiving the current row address;
a control terminal for providing a row selection enable signal to the enabling device;
a logic device configured to be driven by the enabling device according to the row selection enable signal and configured to assert a selection signal based on the received current address; and
a driver element configured to bias the word line associated with the row selection unit to the selection voltage when the selection signal is asserted.

15. The system of claim 14, further including a main logic block configured to generate an address enable signal, the memory device including a row address switch configured to provide the current row address to the address bus when the address enable signal is asserted.

16. The system of claim 15, wherein the main logic block is further configured to generate the row selection enable signal according to the address enable signal.

17. The system of claim 16, wherein the main logic block is configured to assert the row selection enable signal after a predetermined time from the assertion of the address enable signal, the logic device being configured to assert the selection signal in response to the assertion of the row selection enable signal.

18. The system of claim 17, wherein the logic device includes:
a deassertion branch configured to deassert the selection signal for a predetermined deassertion time starting from the assertion of the row selection enable signal;
an assertion branch including the enabling device and a set of address switches coupled with the address bus for receiving the current row address, the assertion branch being configured to assert the selection signal when the current row address corresponds to the row address identifying the word line associated with the row selection unit and the row selection enable signal is asserted.

19. The system of claim 18, wherein the selection signal is the voltage of an output circuit node of the logic device, and wherein:
the deassertion branch includes a first controlled switch connected between the output circuit node and a terminal providing a first reference voltage, said first controlled switch being configured to electrically couple the circuit node to with the terminal providing the first reference voltage during the predetermined deassertion time;
the assertion branch is connected between the output circuit node and a terminal providing a second reference voltage different from the first, said enabling device being a switch controlled by the row selection enable signal and connected in series with the address switches, said assertion branch being configured to electrically couple the circuit node to the terminal providing the second reference voltage when the current row address corresponds to the row address identifying the word line associated with the row selection unit and the row selection enable signal is asserted.

20. The system of claim 19, wherein said selection signal is asserted if the output circuit node is at the second reference voltage.

* * * * *